United States Patent [19]
Garrett et al.

[11] 4,213,562
[45] Jul. 22, 1980

[54] PROGRAMMER

[76] Inventors: Roger Garrett, 23 rue Lissagaray; André Liversain, 50 rue Horace Vernet, both of Saint-Etienne, France

[21] Appl. No.: 902,093

[22] Filed: May 1, 1978

[30] Foreign Application Priority Data

Apr. 29, 1977 [FR] France ............................... 77 13633

[51] Int. Cl.² .................... F23N 5/20; H05B 1/02; G08B 1/00
[52] U.S. Cl. .................... 236/46 R; 219/492; 307/141; 340/309.4
[58] Field of Search ............... 236/46 R, 47; 165/12; 219/492, 486; 307/141; 340/147 P, 309.4; 315/360; 137/624.13

[56] References Cited
U.S. PATENT DOCUMENTS

| | | | |
|---|---|---|---|
| 319,782 | 6/1885 | Carr | 340/147 P |
| 690,623 | 1/1902 | Shore | 307/141 |
| 1,411,497 | 4/1922 | Hill | 307/141 |

Primary Examiner—William E. Wayner
Attorney, Agent, or Firm—Browdy and Neimark

[57] ABSTRACT

A programmer (controller) permits individual control of a plurality of devices associated with the same installation, such as an installation for heating residential rooms, offices, or the like. The programmer includes a clock, at least one counter which periodically receives pulses from the clock, and a programming matrix composed of a double-sided printed circuit. On one side of this circuit, a first plurality of parallel conducting strips are provided, each of which is connected to one output of the counter. On the other side of the circuit, a second plurality of parallel conducting strips are provided, each of which crosses those of the first plurality and is connected to one control circuit of a device. At each intersection of a strip of the first series and a strip of the second series, an aperture is provided which can receive a removable pin which provides an electrical connection between the two sides of the printed circuit.

22 Claims, 6 Drawing Figures

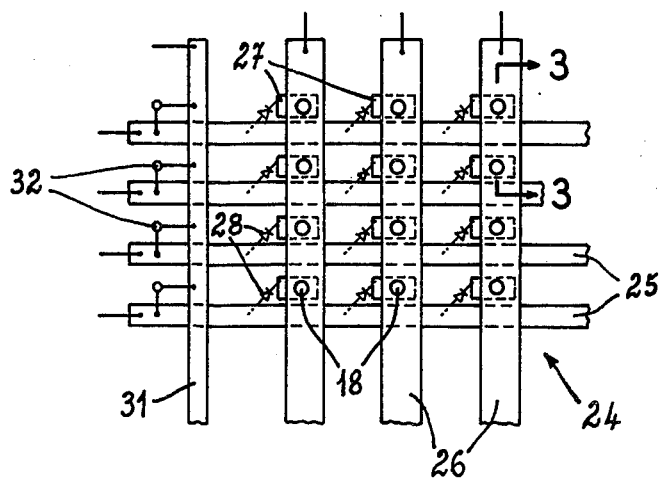
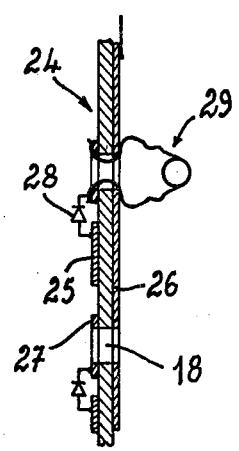
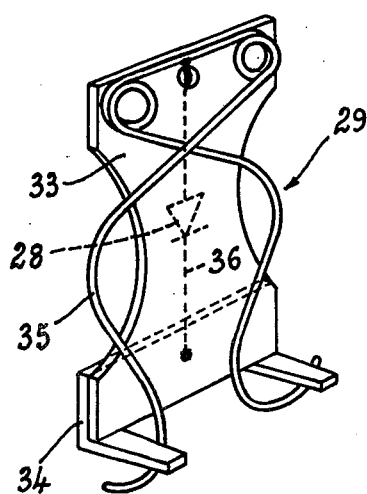
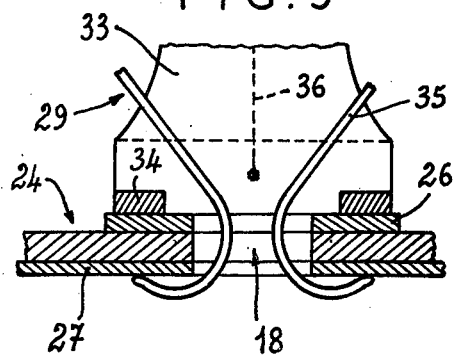

PROGRAMMER

BACKGROUND OF THE INVENTION

This invention relates to a programmer (controller) and, more particularly, a programmer which allows individual control of a plurality of linked devices or groups of devices belonging to an installation, such as an installation for heating the rooms in a residential building, office building, or the like.

If it were desired to control each heater in a given installation separately, for example as a function of the temperature measured in the room where the device is located, and at least one set temperature, it has heretofore been necessary to provide a programmer for each device. In view of the cost which this entails, it has been conventional heretofore to settle for a single programmer for all the rooms incorporating therewith a type of "time switch" system. This solution results in a considerable waste of energy, since it causes all the rooms to be heated simultaneously regardless of whether they are actually occupied or not.

Programming matrices are known which allow programming the function of a plurality of devices in a centralized manner, controlling each device separately. However, these matrices are used in very limited applications at the present time, and, in particular they are not at all suitable for automatic control of room heating.

SUMMARY OF THE INVENTION

It is an object of the present invention to remedy the above-mentioned disadvantages.

It is another object of the present invention to provide a programmer (controller) which allows flexible programming, while remaining simple in construction and inexpensive to construct. The foregoing objects, as well as others are achieved, in accordance with the present invention by providing a programmer which includes; essentially a combination of a clock, at least one pulse counter which periodically receives pulses originating in the clock, and a programming matrix including a double-sided printed circuit, one side being provided with parallel conducting strips forming a first series, each of which is connected to one output of the above-mentioned pulse counter, and on the other side of which other parallel conducting strips are provided, forming a second series intersecting the first series, the strips of the second series each being connected to a control circuit of a device or group of linked devices, a hole being provided in the programming matrix at the intersection of a conducting strip of the first series and a conducting strip of the second series, this hole accepting a removable pin which provides an electrical connection between the two sides of the printed circuit.

Each conducting strip of the first series corresponds for example to one hour of the day, and each conducting strip of the second series corresponds to a heating device, thus allowing individual programming of each device at each hour or fraction of an hour, depending on whether a contact pin has been inserted or removed. Thus, the programmer according to the invention, using a matrix whose design is based on a double-sided printed circuit, is simple and inexpensive, and can result in considerable energy savings through individualized heating of rooms depending on whether the latter are occupied or not.

According to the first embodiment of the programming matrix, a conducting area connected to one of the conducting strips through an isolating diode is provided on the double-sided printed circuit at each intersection of a conducting strip of the first series with a conducting strip of the second series, the aperture provided at the intersection simultaneously traversing the other conducting strip and the conducting area. In this case, each removable pin can be manufactured very simply.

According to another embodiment of the programming matrix, the aperture provided in the double-sided printed circuit at each intersection of a conducting strip of the first series and a conducting strip of the second series directly transverses the two conducting strips, each removable pin being provided with an isolating diode. In this case, the structure of the contact pins is a little more complex, since the latter incorporate the diodes, but the removal of the diodes from the printed circuit makes the manufacture of the latter very simple and considerably reduces its cost.

In view of the envisaged applications, the programmer according to the invention advantageously includes at least two pulse counters, such as a day counter and a week counter, logic circuits being provided to combine the programming on the conducting strips connected to the outputs of the first pulse counter, such as hourly programming, and the programming on the conducting strips connected to the output of the second pulse counter, such as a weekly programming. According to a specific embodiment, the above-mentioned logic circuits include a NAND gate for each device or group of linked devices, one input of said gate being connected to a conducting strip of the second series, connectable to the conducting strips of the first series associated with the first pulse counter, and with the other input connected to a conducting strip of the second series, connectable to the conducting strips of the first series associated with the second pulse counter, the two inputs of said NAND gate also being connected to a switch which allows a temporary override of programming. This switch allows the devices to be controlled without passing through the contacts formed by the removable pins, when desired, thus increasing the flexibility of operation of the programmer.

In cases where the programmer is used in an installation for heating rooms, each conducting strip of the second series on the double-sided printed circuit is preferably connected to one automatic control circuit associated with an electrical heating device or a group of linked heating devices, whose power supply is controlled by an electronic switch as a function of the set temperature and the actual temperature measured by a sensor, the programming matrix making it possible to select for each heating device individually at any hour, either a first set temperature called "normal" operation or a second set temperature called "reduced" operation, means of setting these two temperatures being provided for each heating device, depending on whether a contact pin is inserted or removed at the intersection of the conducting strip of the first series corresponding to the hour in question and the conducting strip of the second series corresponding to the device in question.

Once initial programming has been carried out in this manner, the clock associated with the pulse counter, without any manual intervention, switches the control circuits of each device either to "normal" operation or "reduced" operation, hour by hour and also day by day, if a week counter is provided. Thus, each room can be heated in "normal" operation only during those hours during which it is occupied, and with "reduced" operation during the remaining time in order to maintain a preset minimum temperature, and to keep the entire installation of the "reduced" setting during those days when none of the rooms are occupied, for example on weekends.

The switch which permits a temporary override of the programming is advantageously mounted so that in one position it controls the "normal" operation of each device, regardless of the hour. This ensures adequate temperature in all the rooms in the event of unanticipated or unusual use outside the preestablished program, without it being necessary to change the arrangement of contact pins on the programming matrix. It should be noted that in this case each heating device remains set to the "normal" operating position for which it has been set. According to another arrangement, a second switch can be provided to override the programming temporarily and to control the power supply to all the heating devices from a single common thermostat.

DESCRIPTION OF THE INVENTION

The invention will be better understood from the following description with references to the attached drawings which show as a nonlimiting example one embodiment of a programmer (controller) according to the present invention.

FIG. 2 is a cross section view of a portion of the matrix, showing the arrangement of its conducting strips;

FIG. 3 is a cutaway view along section line 3—3 in FIG. 2 on an enlarged scale, through the printed circuit provided with the conducting strips, this view also showing a possible embodiment of a removable pin to provide an electrical connection between the two sides of the printed circuit;

FIG. 4 is a perspective view a version of a pin with a built-in diode which can be used in the invention.

FIG. 5 is a cross sectional view, similar to FIG. 3, showing the mounting of the pin of FIG. 4 on the printed circuit of the programming matrix;

DETAILED DESCRIPTION OF THE PREFERRED EMBODIMENT

Figure 1:
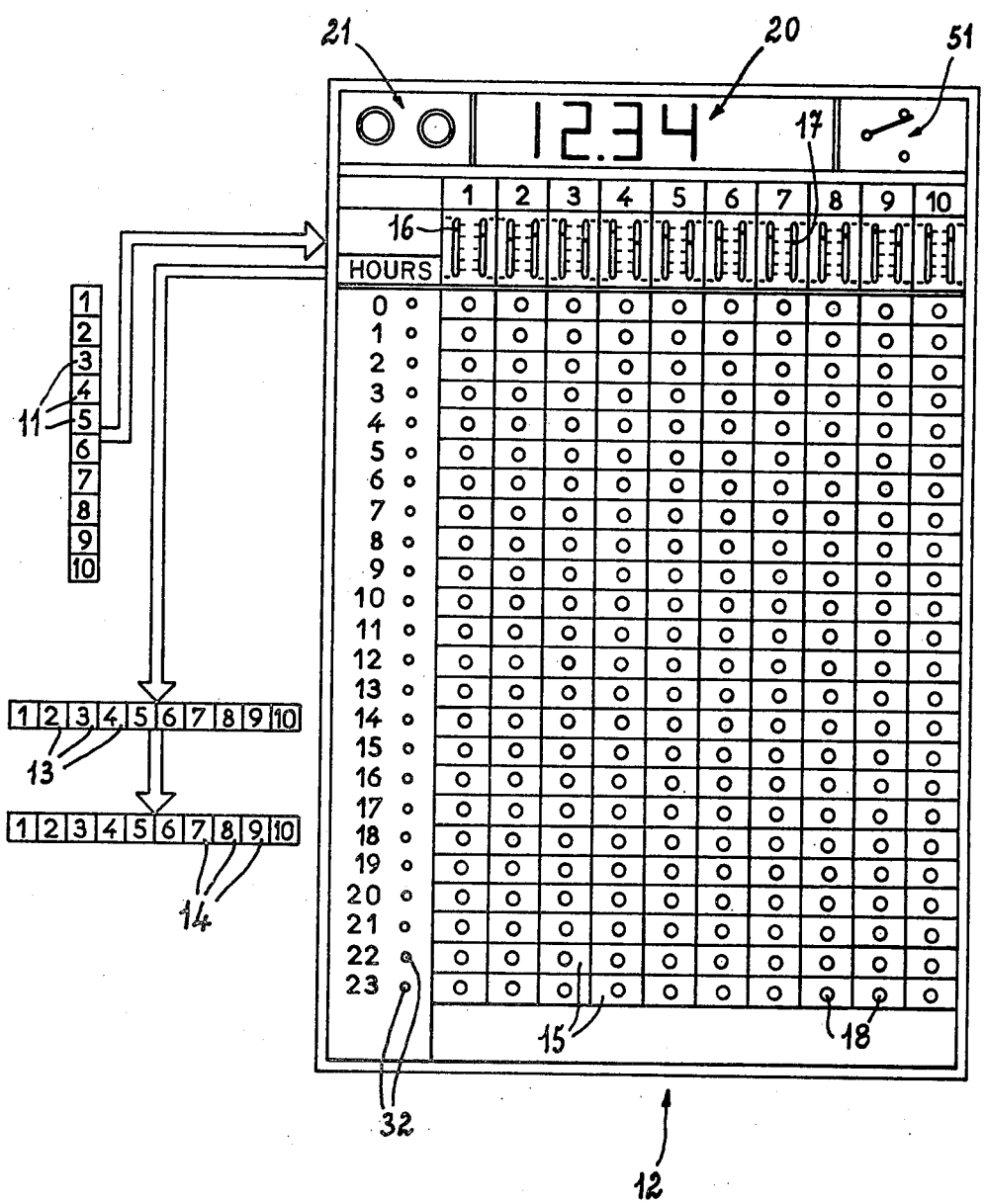
FIG. 1 is a somewhat diagrammatic general view of an installation including a programmer according to the invention, the view showing in particular the external appearance of the programming matrix.

In the above-mentioned embodiment, an installation for heating rooms on an automatically regulated basis is considered, with separate programming of the temperature of each room. A sensor arrangement which includes a plurality of sensors 11 monitors the temperature in that part of each room which it is to control, and transmits the information to a cabinet 12, whose external appearance is shown in FIG. 1. This cabinet 12 is connected to electronic switches 13, triacs for example, equal in number to the number of sensors 11, each of which controls the power to an electric heating device 14 located in the same room as the corresponding one of the sensors 11. The selected example shows ten sensors 11, ten electronic switches 13, as well as ten heating devices 14 represented symbolically by numbered squares 1 to 10 in FIG. 1.

The cabinet includes 12 comprises a programming matrix which permits selection for each of the ten rooms individually, the temperature for each hour of the day and night. This matrix appears from the outside as a table composed of squares 15 having 240 squares, arranged in ten columns representing the ten devices 14 and 24 lines representing the hours from 0000 to 2300 hours.

According to a specific feature of the cabinet discussed herein, each devices 14 is associated with two thermostats, one permitting the temperature for "normal" operating to be adjusted between 18° and 25° C. for example, and the other allowing the temperature during "reduced" operation to be adjusted between 5° and 18° for example. To select these two temperatures, two sliders, numbered 16 and 17 respectively are provided above the squares 15 in each column, these sliders being displaceable over the graduations corresponding to the range of "normal" temperature settings and the other relative to the "reduced" temperature settings.

The programming matrix thus makes it possible to select for each device of the 14 individually and for any hour, either "normal" operation or "reduced" operation, by a simple insertion or removal of contact pins in aperatures 18 provided in each of the squares 15. Theoretically, "normal" operation is selected for those hours when the room corresponding to the device in question is occupied and "reduced" operation is selected for those hours during which the room is not occupied.

Figure 6:
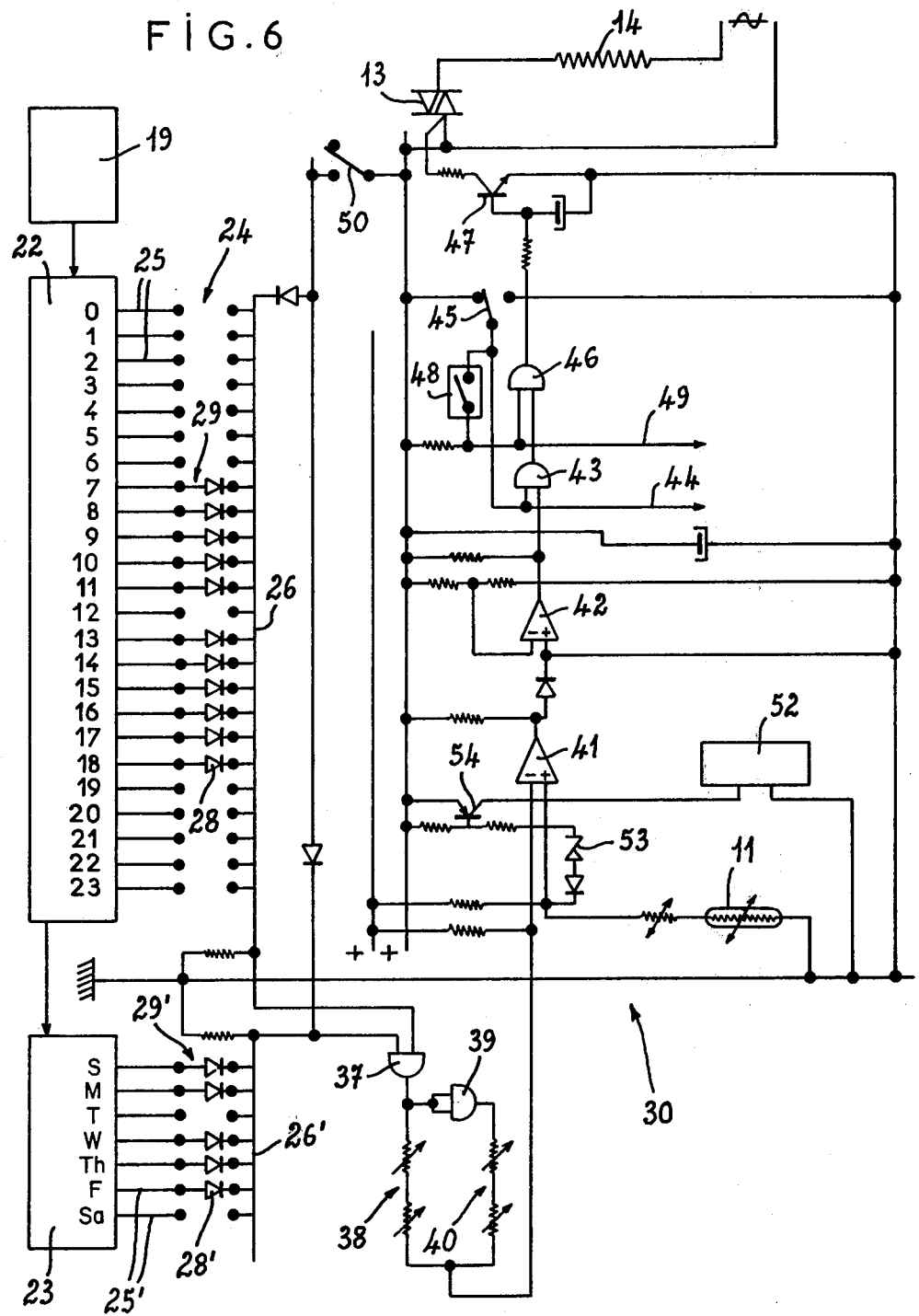
FIG. 6 is a schematic diagram of a control circuit associated with a device and that portion of the programming matrix which is connected to this control circuit.

The cabinet 12 includes an internal mechanical or electronic clock 19, shown symbolically in FIG. 6. To facilitate setting, this clock is provided with an external display 20 and setting buttons 21 as shown in FIG. 1.

The clock 19 delivers one pulse each hour. This pulse advances a day counter 22 provided with 24 outputs. In the case of FIG. 6, this counter 22 controls another week counter 23 provided with 7 outputs. This week counter 23 allows a room to be set to "reduced" operation at any hour, during any day or days of the week when the room is not occupied, The day counter 22 is connected to a double-sided printed circuit 24, shown partially in FIGS. 2 and 3, and disposed immediately below the outer panel of the cabinet 12 which is provided with the squares 15. On its rear side, for example, this printed circuit 24 is provided with horizontal conducting strips 25, all of which are parallel and equidistant, twenty-four in number. On its front side, the same printed circuit 24 is provided with vertical conducting strips 26, all of which are parallel and equidistant, ten in number. At each intersection of a given one of the horizontal strips 25 and a given one of the vertical strips 26, a respective small conducting area 27 is provided disposed on the rear side of the printed circuit 24 and connected to the adjacent one of the horizontal strips 25 by an isolating diode 28.

Each intersection of a given one of the horizontal strips 25 and a given one of the vertical strips 26 corresponds to a given one of the holes 18; each aperture 18 extends into the interior of the cabinet 12, simultaneously traversing one of the vertical strips 26 and one of the conducting areas 27, as shown in FIG. 3. The same figure shows a possible embodiment of a pin 29 introduced into one of the apertures 18. This pin 29 is composed of a metal wire formed into a spring and provided with two symmetrical branches, terminating in hooks, which fit simultaneously into one of the conducting strips 26 and one of the conducting areas 27, thus ensuring an electrical connection between them. Thus, a respective pin 29, through the intermediary of one of the diodes 28, provides an electrical connection between one of horizontal conducting strips 25, corresponding to a specific hour, and one of the vertical conducting strips, corresponding to one of the ten devices 14 of the installation in question. As FIG. 6 shows, each of the horizontal conducting strips 25 is connected to one output of the day counter 22, and each of the vertical conducting strips 26 is connected to a control circuit 30 associated with one of the devices 14.

FIG. 2 shows that the printed circuit 24 can be provided with an additional vertical conducting strip 31, connected to each of the horizontal strips 25 by a conductive circuit connection in which a pilot light 32 has been inserted. The pilot lights 32 are disposed opposite each line in the programming matrix (see FIG. 1) and indicate at any moment in time which of these lines has been selected by the day counter 22.

In a variation, the printed circuit 24 is provided with only two series of the intersecting conducting strips 25 and 26, located respectively on its rear side and front side, the intersections being traversed directly by the holes 18, the conducting areas 27 being omitted (see FIG. 5). The isolating diodes 28 are then mounted on the pins 29. FIG. 4 shows a possible embodiment of such a pin 29 with a built-in diode 28. An insulating plate 33 is mounted on a metal square 34, comprising two legs which provide the "upper" contact with one of the vertical conducting strips 26. An resilient metal wire 35 is mounted on the plate 33, said wire having two symmetrical branches terminating in hooks, said hooks passing through the holes 18 and ensuring "lower" contact with one of the horizontal conducting strips 25. A respective diode 28 is inserted in a conductor 36, one end of which is soldered to the metal square 34 and the other end is soldered to the resilient wire 35.

When the week counter 23 is in fact provided, each of its outputs is connected to one of the seven other horizontal conducting strips 25' as shown in FIG. 6. Other pins 29', similar to the aforementioned pins 29 incorporating for example isolating diodes 28', provide an electrical connection between conducting strips 25' and vertical conducting strip 26', disposed as an extension of one of the strips 26.

The operation is to be described below, with particular reference to FIGS. 1 and 6. Firstly, an operator assures that the day-counter 23 and the hour-counter 19 are correctly set and that the desired "normal" and "reduced" temperatures are set for each room by moving the selective sliders 16 and 17. Contact pins are placed in those of the selected holes 18 for which "normal" temperature is to be provided in any of the rooms at selected hours. FIG. 6 shows a triac for one of the switches 13, it being understood that nine additional triacs and respective identical logic circuitry arrangements are also connected to the conductive strips 25 and 25', one arrangement for each heating device 14 (FIG. 1). Nine additional sensors 11 are provided, one for each additional room (FIG. 1).

The day counter 22 maintains a logic level 1 for one hour at one of its outputs, corresponding to the current hour, the other outputs being at logic level 0. Likewise, the week counter 23 maintains a logic level 1 each day at one of its outputs, while the other six outputs are at logic level 0.

The two corresponding vertical conducting strips 26 and 26' are connected respectively to two inputs of a first NAND gate 37. The strip 26 receives information of logic level 1 each hour for which a given pin 29 is in place, and information with logic level 0 for each hour for which no pin has been inserted. Likewise, the strip 26' receives information of with logic level 1 each day for which a pin 29' has been inserted, and information of logic level 0 for each day for which the pin is missing. If the two inputs of the gate 37 are at level 1, the output of this gate will be at level 0 and this state will connect a first branch 38 which forms a voltage divider, connected to the slider 16 and serving to provide normal operation. A switch 39 connected to the output of the NAND gate 37 simultaneously disconnects a second branch 40 forming a voltage divider, connected in parallel with the first and connected to the slider 17, serving for "reduced" operation. When one or both inputs of the gate 37 is at level 0, the switch will take precedence; the branch 38 will be disconnected and the branch 40 will be connected.

The two branches 38 and 40 of the circuit forming voltage dividers, are connected to a common input of a comparator 41, whose other input is connected to another voltage divider which includes one of the temperature sensors 11, which is for example a sensor of the thus, NTC type (negative temperature coefficient). Thus, comparator 41 compares the set temperature of device 14 in question, as indicated by the branch 38 or 40, and the actual temperature in the room where the device is located, measured by a given sensor 11. As long as there is a difference between the voltages at its two inputs, the comparator 41 will deliver at its output a signal with logic level 1, which is amplified in an amplifier 42 and fed to one input of the a NAND gate 43. The other input of gate 43 is connected to a line 44 which is common to all the control circuits 30 which are similar to the one described above. The logic level in this line 44 can be switched to 0 or 1 by a "automatic/manual" switch 45. The switch 45 is in the "automatic" position, as shown in FIG. 6, the logic level in the line 44 is 1, but the logic level at the output of NAND gate 43 is 0, and this will always be the case when the set and measured temperatures are different. The output signal from the gate 43 is transformed into a signal of logic level 1 at the output of the last NAND gate 46, to be described hereinbelow. The signal at the output of the gate 46 controls a transistor 47 connected to the trigger of a given triac 13 shown in FIG. 6 associated with a given device 14 in question. This triac 13 conducts, allowing alternating current to pass through in a corresponding power device 14. When the voltages at the two inputs of the comparator 41 are equal, the opposite occurs the comparator 41 delivers a signal with level 0, the NAND gate 43 shown in FIG. 6 delivers a signal of level 1, and the NAND gate 46 delivers a signal of level 0, blocking the triac 13 shown in FIG. 6 and thus interrupting the power to the corresponding device 14.

If the switch 45 is set to the "manual" position, the logic level in the line 44 will be 0 and consequently the outputs of all the NAND gates 43 will be at level 1, regardless of the state of the outputs of the comparator 41. A common thermostat 48 is then connected. This thermostat 48 is connected in turn to a common line 49, which is in turn connected to the second inputs of all the NAND gates 46. As long as the contact of thermostat 48 is closed, it keeps a line 49 connected to ground, in other words, all the second inputs of the gates 46 will be at level 0. The output of each gate 46, which is therefore at level 1, will keep the corresponding triac 13 conducting. When the contact of the thermostat 48 opens, the line 49 will change to level 1. The output of each gate 46 will change to level 0 and all the triacs 13 will be blocked.

Thus, the switch 45 allows the entire installation to function on classical "manual" operation temporarily, in other words, by using a the single thermostat 48 which simultaneously controls the heating of all the devices 14.

Another switch 50 is provided, which permits the entire installation to function temporarily on "normal" operation, as defined above. When the contact of this switch 50 is closed, this contact being normally open, the of two inputs of NAND gate 37 are set to logic level 1, so that the branch 38 corresponding to normal operation is placed in the circuit, regardless of the time or the day.

On the front panel of the cabinet 12, the controls for the two switches 45 and 50, which permit complete or partial override of the programming when desired, can be regrouped as shown at 51 in FIG. 1.

It is interesting to note, although it does not correspond to the goal of the invention, that the control circuit 30 can also serve to sound an alarm 52, which functions in the event of excess temperature, for example if a fire breaks out. For this purpose, a particular sensor 11 is connected by a branch of a circuit comprising in particular a Zener diode 53, to a transistor 54 which controls the power to alarm 52.

Of course, the schematic of control circuit 30 shown in FIG. 6 is provided as a nonlimiting example and any other equivalent means, especially logic circuits using other types of gates connected differently but producing the same result can be used without departing from the scope of the invention.

Thus, it follows from the above that the invention is not limited to the single embodiment of this programmer which has been described hereinabove as an example; on the contrary, it includes all variations comprising equivalent means.

Similarly, the invention is not limited to the single specific application described hereinabove and shown in the drawing, and, on the contrary, can be subjected to various adaptations. Thus, each control circuit can be associated not with a single device, but with a plurality of devices, which can always function in the same manner. In addition, the devices in question are not necessarily heating devices, but can also be for example lighting fixtures, in which case the programming matrix permits initial selection of the rooms to be illuminated as a function of the hour, while the temperature sensors can be replaced by photoelectric cells. The programmer according to the invention can also serve to allow delicate devices to function only at certain hours, such as computers, always according to the same principle, namely that the use of the circuits comprising the comparators is not necessary. Finally, to demonstrate the universal nature of this invention, we should like to point out that there is nothing to prevent the use of a given programming matrix connected simultaneously to devices of different types, for example to heating devices on the one hand and illuminating fixtures on the other simultaneously.

We claim:

1. A programmer comprising a clock, at least one counter which receives periodically pulses originating in said clock, and a programming matrix including a double-sided printed circuit, on one side of which a first series of parallel conducting strips are provided, each of which is connected to a respective output of said counter and on the other side of which a second series of parallel conducting strips are provided, said second series of strips are non-conductively intersecting said first series being connected to a control circuit for at least one device, a respective aperture in said programming matrix at each nonconductive intersection of a conducting strip of the first series and a conducting strip of the second series for receiving a removable conductive pin which provides an electrical connection between said two sides of the printed circuit, and including a respective conducting area provided on said double-sided printed circuit at each intersection of a conducting strip of said first series and a conducting strip of said second series, at least one of said conducting areas being connected to one of said conducting strips of one of said series by an isolating diode, a respective said aperture being provided at least one of said intersections associated with said diode simultaneously transversing a conducting strip of the other of said series and said conducting area.

2. A programmer according to claim 1, wherein each said removable pin is composed of a metal wire forming a spring and being provided with two substantially symmetrical branches terminating in hooks, capable of being attached simultaneously to one of said conducting strips and one of said conducting areas.

3. Programmer according to claim 1, wherein said respective aperture provided in said double-sided printed circuit at each said intersection of a conducting strip of said first series and a conducting strip of said second series, directly traverses these two conducting strips, each removable pin being provided with an isolating diode.

4. A programmer according to claim 3, wherein each said removable pin is composed of an insulating plate, mounted on a metal square capable of providing contact with one of said conducting strips and being provided with a resilient metal wire provided with two symmetrical branches terminating in hooks, capable of traversing a corresponding one of said apertures and providing a contact with another of said conducting strips said diode being inserted in a conductive circuit one end of which is soldered to said square piece and the other is soldered to said resilient wire.

5. A programmer according to claim 1, including an additional conducting strip in said second series provided on said double-sided printed circuit, said additional conducting strip being connected by a conductive circuit in which a pilot light is inserted for each of said strips of said first series which is connected to said outputs of said counter.

6. A programmer according to claim 1, wherein said at least one counter comprises a first counter and a second counter, and logic circuits provided to combine programming from said conducting strips connected to outputs of said counter to provide given period programming, and to combine programming from said conducting strips connected to outputs of said second counter to provide relatively longer period programming.

7. A programmer according to claim 1, including at least one switch means for permitting temporary override of programming, without affecting said removable pins.

8. A programmer according to claim 7, wherein said at least one counter comprises a first counter and a second counter, and logic circuits provided to combine programming from said conducting strips connected to outputs of said first counter to provide given period programming, and to combine programming from said conducting strips connected to outputs of said second counter to provide relatively longer period programming, and wherein said logic circuits include for each said device or group thereof, a NAND gate, one input of which is connected to a conducting strip of said second series, connectable to said conducting strips of said first series associated with said first counter, and whose other input is connected to a conducting strip of said second series, connectable to said conducting strips of said first series associated with said second counter, said two inputs of said NAND gate also being connected to said switch means which permits temporarily overriding programming.

9. Programmer according to claim 8, wherein each said conducting strip of said second series on said double-sided printed circuit is connected to an automatic control circuit associated with an electrical heating device constituting said at least one device or a group thereof whose power is controlled by an electronic switch as a function of set temperature and actual temperature measured by a sensor, said programming matrix making it possible to select, for each individual heating device or group thereof at any time, either a first NORMAL set temperature operation, or a second REDUCED set temperature operation depending on whether a given said contact pin is inserted or withdrawn at an intersection of said conducting strip of said first series corresponding to an hour in question and said conducting strip of said second series corresponding to said device in question, and including means of setting these two said set temperatures being provided for each said heating device.

10. A programmer according to claim 9, including switch means operatively arranged so that in one position it controls NORMAL operation of each said device regardless of time.

11. A programmer according to claim 10, including a second switch means provided for overriding temporarily programming to control power to all said heating devices from a single common thermostat.

12. A programmer comprising a clock, at least one counter which receives periodically pulses originating in said clock, and a programming matrix on one side of which a first series of parallel conducting strips are provided, each of which is connected to a respective output of said counter and on the other side of which a second series of parallel conducting strips are provided, said second series of strips are non-conductively intersecting said first series being connected to a control circuit for at least one device, a respective aperture in said programming matrix at each non-conductive intersection of a conducting strip of the first series and a conducting strip of the second series for receiving a removable conductive pin which provides an electrical connection between said two sides of said matrix, and wherein each said conducting strip of said second series on said matrix is connected to an automatic control circuit associated with an electrical heating device constituting said at least one device or a group thereof whose power is controlled by an electronic switch as a function of set temperature and actual temperature measured by a sensor, said programming matrix making it possible to select, for each individual heating device or group thereof at any time, either a first NORMAL set temperature operation, or a second REDUCED set temperature operation depending on whether a given said contact pin is inserted or withdrawn at an intersection of said conducting strip of said first series corresponding to an hour in question and said conducting strip of said second series corresponding to said device in question, and including means of setting these two said set temperatures being provided for each said heating device.

13. A programmer according to claim 12, wherein said programming matrix, with its two series of conducting strips, is composed of a double-sided printed circuit.

14. A programmer according to claim 13, including a conducting area provided on said double-sided printed circuit at each intersection of a conducting strip of said first series and a conducting strip of said second series, at least one said area being connected to one of said conducting strips by an isolating diode, an aperture being provided at that intersection traversing simultaneously a conducting strip of the other series and said conducting area.

15. A programmer according to claim 14, wherein each said element ensuring an electrical connection between said two sides of the matrix is a respective removable pin, composed of a metal wire forming a spring and possessing two symmetrical branches terminating in hooks, capable of being engaged simultaneously with the conducting strip and the conducting area to be connected.

16. A programmer according to either claim 12 or claim 13, wherein each said element which ensures an electrical connection between the two sides of said matrix is a removable pin composed of an insulating plate, mounted on a metal square capable of providing contact with one of the conducting strips and being provided with a resilient metal wire provided with two symmetrical branches terminating in hooks, capable of traversing a hole provided at the corresponding intersection of the two conducting strips and ensuring contact with the other conducting strip, an isolating diode being inserted in a conductor, one end of said conductor being soldered to the square and the other end being soldered to the resilient wire.

17. A programmer according to either claim 12 or claim 13, wherein an additional conducting strip of the second series is provided on the programming matrix, said additional conducting strip being connected by a conductor, in which a pilot light is inserted, to each of the strips of the first series which are connected to the outputs of the pulse counter.

18. A programmer according to either claim 12 or claim 13, wherein said at least one counter comprises at least two pulse counters, such as a day counter and a week counter, logic circuits being provided to combine hourly programming produced on the conducting strips connected to the outputs of the first pulse counter, and programming provided on the conducting strips connected to the outputs of the second pulse counter.

19. A programmer according to either claim 12 or claim 13, including at least one switch permitting a temporary override of programming, controlling the devices of groups of linked devices without passing through the elements which provide the electrical connection between the two sides of the matrix.

20. A programmer according to claim 18, wherein said logic circuits comprise, for each device or group of linked devices, a NAND gate, one input of which is connected to a conducting strip of the second series, connectable to the conducting strips of the first series, associated with the first said pulse counter, and with the other input connected to a conducting strip of the second series, connectable to the conducting strips of the first series associated with the other said pulse counter, the two inputs of said NAND gate also being connected to a switch permitting a temporary override of programming.

21. A programmer according to claim 20, wherein said switch is so disposed that in one position it controls the "normal" operation of each said device, regardless of the time.

22. A programmer according to claim 21, including a second switch provided temporarily to override programming and to control the power supply to all the heating devices from a single common thermostat.

* * * * *